(12) United States Patent
Prior

(10) Patent No.: US 7,029,952 B2
(45) Date of Patent: Apr. 18, 2006

(54) METHOD FOR MAKING A SEMICONDUCTOR PACKAGE AND SEMICONDUCTOR PACKAGE WITH INTEGRATED CIRCUIT CHIPS

(75) Inventor: Christophe Prior, Le Versoud (FR)

(73) Assignee: STMicroelectronics S.A., Montrouge (FR)

( * ) Notice: Subject to any disclaimer, the term of this patent is extended or adjusted under 35 U.S.C. 154(b) by 0 days.

(21) Appl. No.: 10/466,900

(22) PCT Filed: Jan. 21, 2002

(86) PCT No.: PCT/FR02/00222

§ 371 (c)(1),
(2), (4) Date: Jan. 16, 2004

(87) PCT Pub. No.: WO02/058131

PCT Pub. Date: Jul. 25, 2002

(65) Prior Publication Data

US 2004/0113259 A1    Jun. 17, 2004

(30) Foreign Application Priority Data

Jan. 22, 2001  (FR)  .................................. 01 00815

(51) Int. Cl.
*H01L 21/44* (2006.01)
*H01L 21/48* (2006.01)
*H01L 21/50* (2006.01)

(52) U.S. Cl. ...................................... 438/125; 438/126
(58) Field of Classification Search ................ 438/106, 438/118, 125, 126, 123, 124, 928, 618; 257/704, 257/706, 707, 684, 782, 783
See application file for complete search history.

(56) References Cited

U.S. PATENT DOCUMENTS 5,905,636 A * 5/1999 Baska et al. ................. 361/705

* cited by examiner

*Primary Examiner*—Hoai Pham
*Assistant Examiner*—Dana Farahani
(74) *Attorney, Agent, or Firm*—Lisa K. Jorgenson; Stephen Bongini; Fleit, Kain, Gibbons, Gutman, Bongini & Bianco P.L.

(57) ABSTRACT

Method of fabricating a semiconductor package and semiconductor package containing an integrated circuit chip having, on one front face, electrical connection regions, in which a first multilayer plate (2) comprising an assembly face (2a) is furnished with an adhesive layer (8) and which has through-holes (9); and a second plate (3) has a recess (13) made in one assembly face (3a) fastened to the assembly face of the first plate via the said adhesive layer; the said chip (4) being placed in the said recess in a position such that its front face is fastened to the assembly face of the first plate via the said adhesive layer and that its electrical connection regions are located facing the through-holes of this first plate, and the bottom of the recess of the said second plate bearing against the rear face of the chip opposite the front face.

7 Claims, 3 Drawing Sheets

METHOD FOR MAKING A SEMICONDUCTOR PACKAGE AND SEMICONDUCTOR PACKAGE WITH INTEGRATED CIRCUIT CHIPS

CROSS-REFERENCE TO RELATED APPLICATIONS

This application is based upon and claims priority from prior French Patent Application No. 01/00815, filed Jan. 22, 2001, the entire disclosure of which is herein incorporated by reference.

BACKGROUND OF THE INVENTION

1. Field of the Invention

The present invention relates to the field of packaging or encapsulating integrated circuit chips and the field of semiconductor packages containing such chips.

2. Description of Related Art

The most common method of producing semiconductor packages containing integrated circuit chips consists in fastening the chip to a support member equipped with external or internal electrical connection lines, for example a plate or a gate, and in encapsulating the chip and in part the support and electrical connection member in an encapsulation material by injection moulding. According to a less common technique, the encapsulation material is replaced by a lid enveloping the chip at a distance and installed after fastening the chip to the support and electrical connection member.

Although giving satisfaction for most of the time, these techniques require the implementation of expensive tools and of relatively lengthy fabrication steps. These semiconductor packages produced sometimes have weaknesses particularly with regard to their mechanical strength or with regard to their resistance to corrosion, leading to a deterioration of the electrical connection pads of the chips and of the electrical connection means between these pads and the exterior of the packages. Furthermore, the known packages fabricated especially by injection use relatively expensive materials.

SUMMARY OF THE INVENTION.

The aim of the present invention is in particular to solve, at least partially, the problems mentioned above.

The subject of the present invention is firstly a method of fabricating a semiconductor package containing an integrated circuit chip having, on one assembly face, electrical connection regions.

According to the invention, this method consists: in taking a first multilayer plate, one assembly face of which is coated with an adhesive layer which can be activated and in producing through-holes through this plate, geometrically distributed depending on the distribution of the said electrical connection regions of the chip; in taking a second plate and in producing a recess in one assembly face of this second plate capable of receiving the said chip; in placing the said chip on the said assembly face of the said first plate in a position such that the aforementioned electrical connection regions of the chip are facing the said holes of this first plate and the said assembly face of the said second plate on the said assembly face of the said first plate, the said chip being engaged in the said recess; and in exerting a pressure in the direction in which the said plates come together so that the said chip is sandwiched between the assembly face of the said first plate and the bottom of the recess of the said second plate and that the said adhesive layer is compressed between the said assembly faces of the said plates and between the assembly face of the said first plate and the assembly face of the chip, such that the said plates are fastened by activating the said adhesive layer.

According to the invention, subsequently, the method consists, preferably, in filling at least partially the said holes of the said first plate with an electrical connection material.

According to the invention, the method may consist in placing, on the said assembly face of the said first plate, the said chip then the said second plate by engaging the chip in the recess of the second plate.

According to the invention, the method may consist in adhesively fastening the chip in the recess of the second plate then in placing this second plate furnished with the chip on the said assembly face of the said first plate.

According to the invention, the method preferably consists in furnishing the electrical connection regions of the chip with projecting electrical connection pads, these electrical connection pads being engaged in the holes of the first plate while it is being assembled.

According to the invention, the method preferably consists in filling the said holes of the first plate with an electrical connection material so as to produce projecting electrical connection pads on the face of the said first plate opposite its assembly face.

The subject of the present invention is also a semiconductor package containing an integrated circuit chip having, on one front face, electrical connection regions.

According to the invention, this package comprises: a first multilayer plate, one assembly face of which is furnished with an adhesive layer and which has through-holes; and a second plate which has a recess made in one assembly face fastened to the assembly face of the first plate via the said adhesive layer; the said chip being placed in the said recess in a position such that its front face is fastened to the assembly face of the first plate via the said adhesive layer and that its electrical connection regions are located facing the through-holes of this first plate, and the bottom of the recess of the said second plate bearing against the rear face of the chip opposite the front face.

According to the invention, the holes of the said first plate are preferably filled with an electrical connection material producing projecting electrical connection pads on the face of this first plate opposite its assembly face.

According to the invention, the said first plate preferably comprises an outer layer opposite its assembly face made of a material forming a moisture barrier, in particular made of Teflon or of a fluoropolymer.

According to the invention, the said first plate preferably comprises an interlayer made of a plastic, in particular made of a thermoplastic or made of a liquid crystal polymer LCP.

According to the invention, the said second plate preferably comprises an outer layer opposite its assembly face made of a material forming a moisture barrier, in particular made of Teflon or of a fluoropolymer.

According to the invention, the said second plate preferably comprises an interlayer made of a plastic, in particular made of a thermoplastic or made of a liquid crystal polymer (LCP).

According to the invention, the assembly face of the said second plate is preferably furnished with an adhesive layer.

According to the invention, an adhesive layer is preferably inserted between the bottom of the recess of the said second plate and the rear face of the chip.

According to the invention, the package may advantageously comprise a heat sink block passing through an opening in the said second plate and having one face fastened bearing against the rear face of the chip.

BRIEF DESCRIPTION OF THE DRAWINGS

The present invention will be better understood on studying a semiconductor package containing an integrated circuit chip and a method of fabricating this package, described by way of non-limiting examples and illustrated by the drawing in which.

DETAILED DESCRIPTION OF PREFERRED EMBODIMENTS

Figure 1:
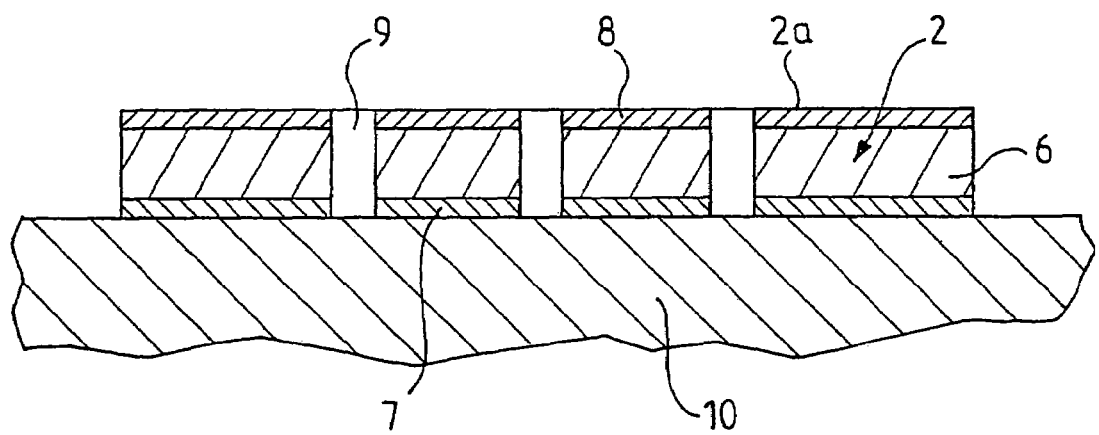
FIG. 1 shows a transverse section of a first plate of the aforementioned package, in a position corresponding to a first fabrication step of this package.

With reference to FIGS. 1 to 5, the various fabrication steps of a semiconductor package 1 will be described.

This semiconductor package 1 comprises a first plate 2 which has an assembly face 2a, a second plate 3 which has an assembly face 3a, and an integrated circuit chip 4 which has an assembly face 4a on which a multiplicity of electrical connection regions 5 is distributed.

The first plate 2 is prefabricated so as to have a stiff inner layer 6 made of a plastic preferably having a melting point greater than 300° C., for example made of a thermoplastic or made of a liquid crystal polymer (LCP), one face of which is coated with a layer 7 forming a moisture barrier, for example made of a Teflon or a fluoropolymer, and the other face of which is coated with an insulating adhesive layer 8 which can be activated forming the assembly face 2a.

Figure 2:
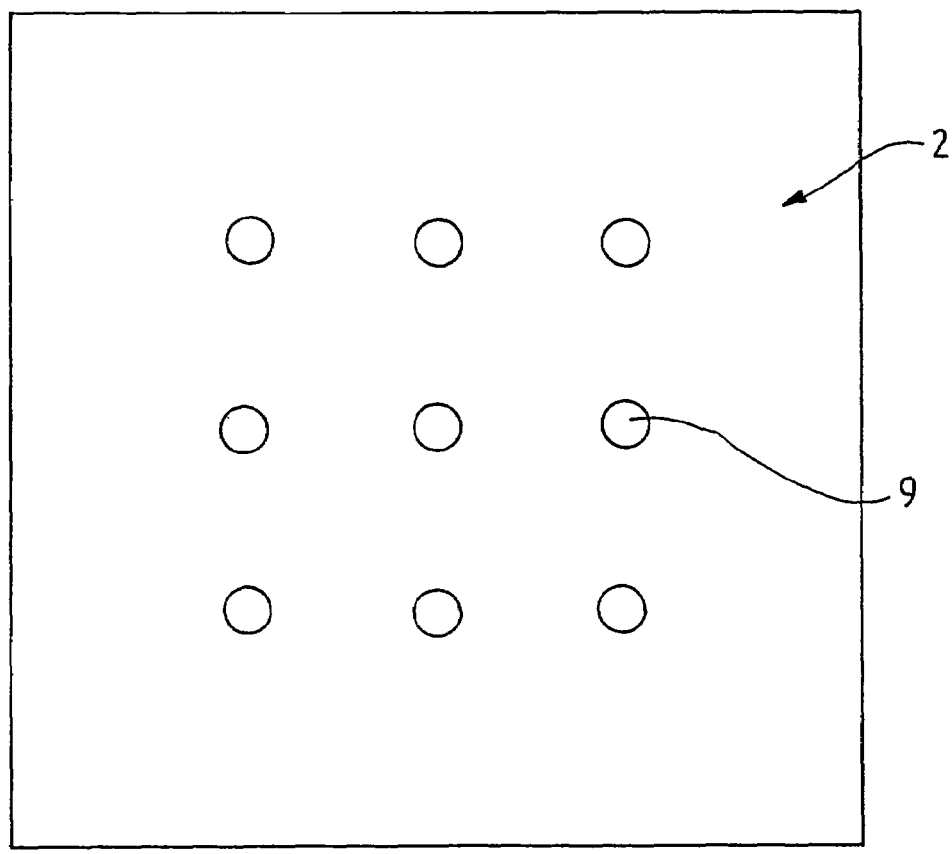
FIG. 2 shows a top view of the first plate of FIG. 1.

The first plate 2 has a multiplicity of through-passages 9 which are distributed so as to correspond to the geometrical distribution of electrical connection regions 5 of the chip 4 as is shown more specifically in FIG. 2.

As is shown in FIG. 1, a fabrication step consists in placing the first plate 2 thus constituted on a table 10 of a machine, furnished with conventional means for holding the plate 2, for example by suction, the outer layer 7 being placed in contact with the table 10. This operation can be carried out by a pick-and-press head 11 of the machine, shown in FIG. 4.

Figure 3:
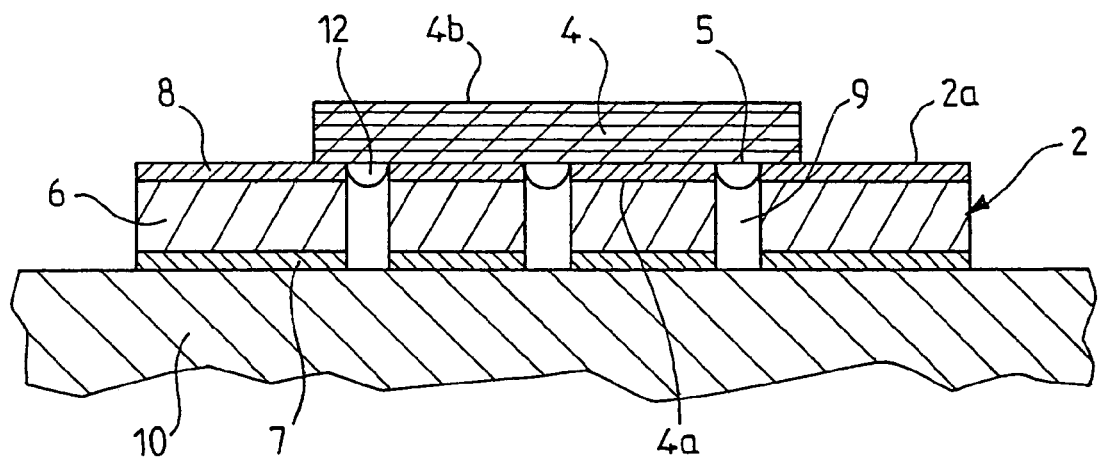
FIG. 3 shows a transverse section of the aforementioned first plate, furnished with an integrated circuit chip, in positions corresponding to a second fabrication step of the package.

As is shown in FIG. 3, the electrical connection regions 5 of the chip 4 are furnished in advance with projecting electrical connection pads 12.

A following fabrication step consists in placing the chip 4 on the first plate 2 in a position such that its assembly face 4a bears against the assembly face 2a of the first plate 2, on its adhesive layer 8, and that the electrical connection pads 12 engage in the through-holes 9 corresponding to this plate. This operation is advantageously carried out by the pick-and-press head 11.

The second plate. 3, which for example consists of a material identical to that of the interlayer 6 of the first plate 2, has, in its assembly face 3, a recess 13 whose section parallel to its assembly face 3a is slightly above the section of the chip 4 parallel to its assembly face 4a and whose depth corresponds to the thickness of the chip 4.

Figure 5:
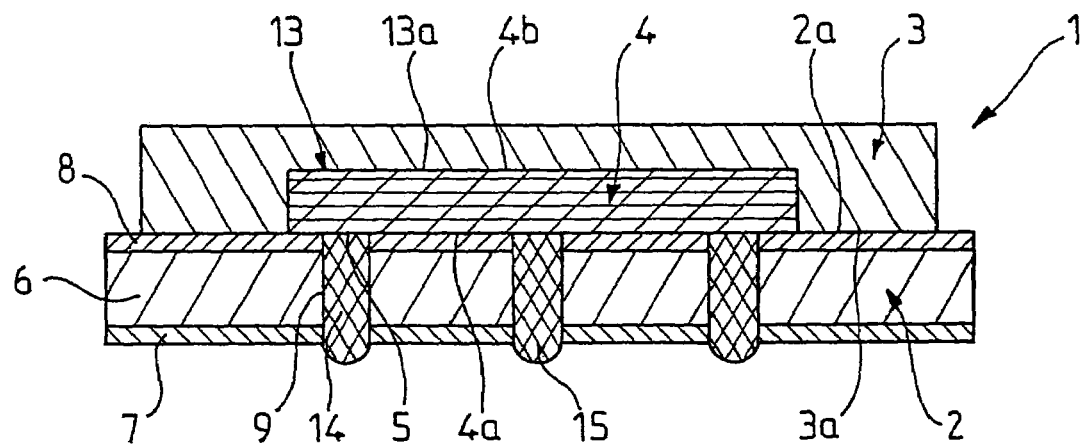
FIG. 5 shows, in transverse section, a final semiconductor package according to the present invention, after a fourth fabrication step.

As is shown in FIG. 5, a following fabrication step consists in placing the second plate 3 of the first plate 2 by engaging the chip 4 in the recess 13 such that in the final position, the bottom 13a of the recess 13 bears against the rear face 4b of the chip 4 and that its assembly face 3a surrounding the recess 13 bears against the assembly face 2a of the first plate 2. To carry out such an operation, the pick-and-press head 11 is advantageously used.

In a following fabrication step, the pick-and-press head 11 is held on the second plate 3 and exerts a pressure towards the table 10 in the direction in which the plates 2 and 3 come together, so that the chip is sandwiched between the assembly face 2a of the first plate 2 and the bottom 13a of the recess 13 of the second plate 3.

Under the effect of the pressure exerted, the adhesive layer 8 of the first plate 2 is compressed over its entire surface by the assembly face 4a of the chip 4 and by the assembly face 2a of the second plate 3 and can be activated depending on its actual characteristics so as to form a sealed joint.

The adhesive layer 8 may in fact be chosen so as to be activated simply by exerting pressure, or by an external means, for example consisting of a means of heating the table 10.

As is shown in FIG. 5, a following fabrication step consists in filling the holes 9 of the first plate 2 with an electrical connection material 14, merging with the material forming the pads 12 of the chip 4, so as to form outer, preferably projecting, electrical connection pads 15.

The semiconductor package 1 thus obtained especially has the following advantages, which result mainly from the continuity of the adhesive layer 8 and from the fact that the chip 4 is completely enclosed.

The adhesive layer 8 makes it possible to assemble the plates 2 and 3 and the chip 4 and provides compensation for any differences between the thickness of the chip 4 and the depth of the recess 13 of the second plate 3.

The adhesive layer 8 forms a continuous electrical insulation and sealing barrier with regard to electrical connection regions 5 and electrical connection pads 12 extended by the electrical connection pads 15, each from the others and from the outside of the package 1.

The outer layer 7 contributes to protecting the electrical connection regions 5 and the electrical connection pads 12 extended by the electrical connection pads 15.

The interlayer 6 of the first plate 2 and the second plate 3 provide the stiffness for the package 1.

Figure 4:
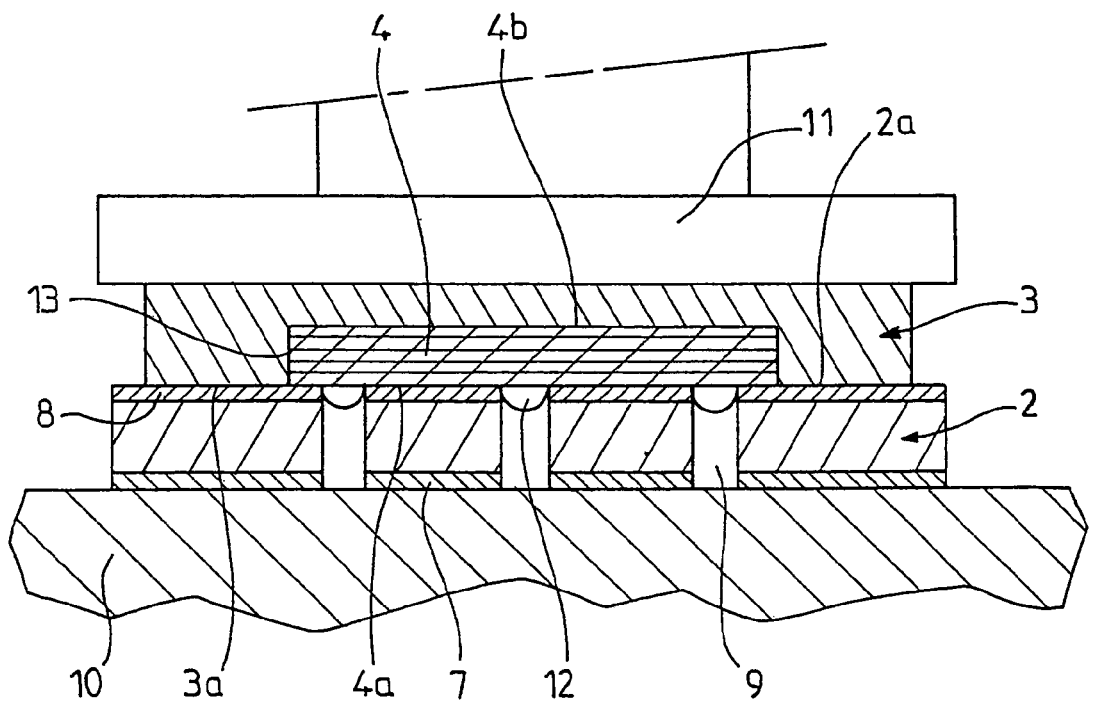
FIG. 4 shows a transverse section of the aforementioned first plate furnished with the integrated circuit chip and with a second plate, in positions corresponding to a third fabrication step of the aforementioned package.

In a fabrication variant, the chip 4 could be previously fastened in the recess 13 of the second plate 3, for example via an adhesive layer inserted between the rear face 4b of the chip 4 and the bottom 13a of the recess 13 and this assembly could be placed on the first plate 2 arranged on the table 10 in order to be assembled to the latter as described with reference to FIG. 4.

In a structural variant, the second plate 3 could be equivalent to the first plate 2 and have an interlayer made of a plastic such as a thermoplastic or made of a liquid crystal polymer (LCP), an outer layer protecting against moisture and an inner adhesive layer on its assembly face 2a.

Figure 6:
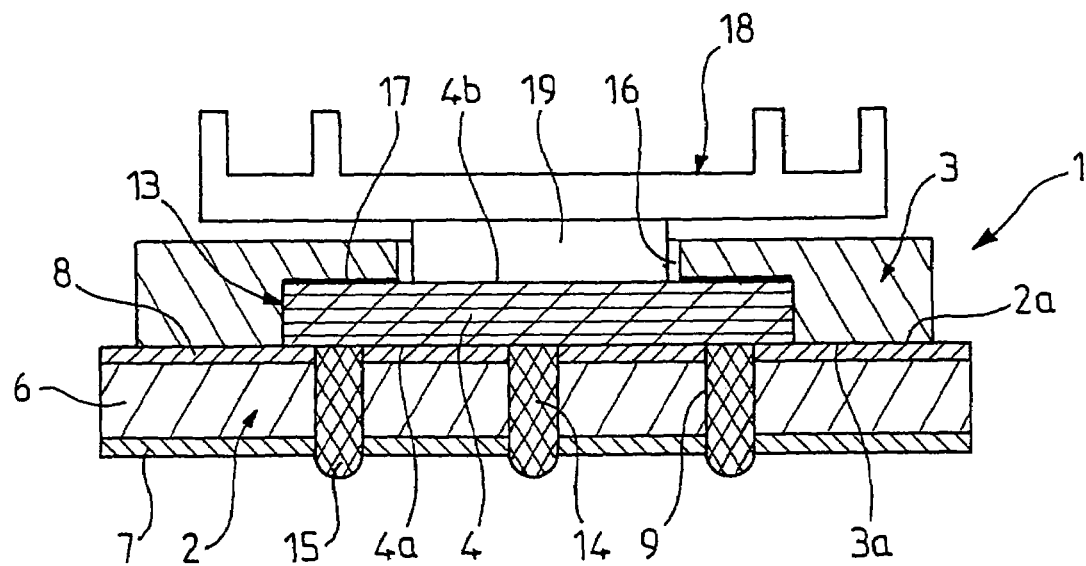
FIG. 6 shows, in transverse section, a variant embodiment of the aforementioned semiconductor package, after a fifth fabrication step.

In a further alternative embodiment shown in FIG. 6, the second plate 3 has an opening 16 opening out into the bottom 13a of the recess 13, a sealed annular adhesive layer 17 then preferably being inserted between the chip and the wall of the recess 13 of this second plate 3.

Thus, a heat sink unit 18 can subsequently be mounted on the package 1 by engaging a part 19 of this unit 18 through the opening 16, this part 19 being, for example, fastened flat against the rear face 4b of the chip 4 by a layer of hot-melt adhesive.

The present invention is not limited to the examples described above. Many other alternative embodiments are possible without departing from the scope defined by the appended claims.

What is claimed is:

1. A method of fabricating a semiconductor package containing an integrated circuit chip that has electrical connection regions on an assembly face, said method comprising the steps of:

providing a first multilayer plate that includes through-holes and an assembly face coated with an adhesive layer, the trough-holes passing through the first plate and being geometrically distributed based on the distribution of the electrical connection regions of the chip;

providing a second plate that includes an assembly face and a recess in the assembly face, the recess being capable of receiving the chip;

placing the first and second plates together such that the chip is positioned on the assembly face of the first plate with the electrical connection regions of the chip facing the through-holes of the first plate, and such that the assembly face of the second plate is on the assembly face of the first place with the chip engaged in the recess of the second plate; and exerting pressure in a direction in which the first and second plates come together so that the chip is sandwiched between the assembly face of the first plate and a bottom of the recess of the the second plate and so that the adhesive layer is compressed between the assembly faces of the first and second plates and between the assembly face of the first plate and the assembly face of the chip, so as to activate the adhesive layer to fasten the first and second plates.

2. The method according to claim 1, further comprising the step of at least partially filling the through-holes of the first plate with an electrical connection material.

3. The method according to claim 1, wherein the placing step includes the sub-steps of:

placing the chip on the assembly face of the first plate; and after placing the chip on the assembly face of the first plate, placing the assembly face of the second plate on the assembly face of the first plate such that the chip is positioned in the recess of the second plate.

4. The method according to claim 1, wherein the placing step includes the sub-steps of:

adhesively fastening the chip in the recess of the second plate; and after adhesively fastening the chip in the recess of the second plate, placing the assembly face of the second plate on the assembly face of the the first plate.

5. The method according to claim 1, further comprising the step of:

furnishing the electrical connection regions of the chip with projecting electrical connection pads, wherein in the placing step, the electrical connection pads are engaged in the through-holes of the first plate.

6. The method according to claim 1, further comprising the step of filling the through-holes of the first plate with an electrical connection material so as to produce projecting electrical connection pads on the face opposite the assembly face of the first plate.

7. The method according to claim 1, further comprising the step of fastening a heat sink unit to a rear face of the chip such that the heat sink unit passes through an opening in the second plate.

* * * * *